United States Patent
Lee et al.

(10) Patent No.: US 7,286,350 B2
(45) Date of Patent: Oct. 23, 2007

(54) LENGTH-ADJUSTABLE FAN DUCT DEVICE

(75) Inventors: Hsieh-Kun Lee, Tu-Cheng (TW); Cui-Jun Lu, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 10 days.

(21) Appl. No.: 11/265,401

(22) Filed: Nov. 1, 2005

(65) Prior Publication Data

US 2006/0140757 A1    Jun. 29, 2006

(30) Foreign Application Priority Data

Dec. 24, 2004    (CN)    .................... 2004 2 0103468

(51) Int. Cl.
*H05K 7/20* (2006.01)
*H01L 23/34* (2006.01)

(52) U.S. Cl. .................. 361/695; 361/694; 361/692; 257/712

(58) Field of Classification Search ............... 285/23, 285/205, 216, 158; 403/109.1, 109.2, 109.3, 403/109.6; 165/135, 137, 177, 178; 361/688–690, 361/692–695; 454/64, 184; 174/15.1, 16.1
See application file for complete search history.

(56) References Cited

U.S. PATENT DOCUMENTS

| | | | | |
|---|---|---|---|---|
| 5,741,030 A * | 4/1998 | Moore et al. | ................ | 285/23 |
| 5,871,396 A * | 2/1999 | Shen | ................ | 454/184 |
| 6,657,863 B2 | 12/2003 | Lee et al. | | |
| 6,736,196 B2 | 5/2004 | Lai et al. | | |
| 6,791,837 B2 * | 9/2004 | Chen et al. | ................ | 361/695 |
| 6,871,879 B2 | 3/2005 | Gan | | |
| 6,969,234 B2 * | 11/2005 | Lin | ................ | 415/214.1 |
| 7,088,584 B2 * | 8/2006 | Chen | ................ | 361/695 |
| 7,100,676 B2 * | 9/2006 | Li et al. | ................ | 165/80.3 |
| 7,126,819 B2 * | 10/2006 | Liang | ................ | 361/695 |
| 2006/0023419 A1 * | 2/2006 | Kao et al. | ................ | 361/690 |

* cited by examiner

*Primary Examiner*—Lisa Lea-Edmonds
*Assistant Examiner*—Anthony M Haughton
(74) *Attorney, Agent, or Firm*—Morris Manning Martin LLP; Tim Tingkang Xia, Esq.

(57) ABSTRACT

A fluid guiding device (1) includes a ventilating pipe (10), a barrel (20) and a holding frame (30). The ventilating pipe includes two spring levers (154). A handling tab (156) and an engaging tab (158) extend from a free end of each spring lever, respectively outwardly and inwardly. The barrel forms two jagged members (262) thereon. Each jagged member forms a plurality of parallel teeth (264). The engaging tabs are selectively engaged with corresponding teeth respectively to position the barrel to the ventilating pipe when the barrel is moved to a desired location in the ventilating pipe. The engaging tabs escape from teeth by pulling the handling tabs outwardly to allow the barrel to be movable on the ventilating pipe. The holding frame is secured to the barrel for holding a fluid-driving device thereon.

18 Claims, 5 Drawing Sheets

LENGTH-ADJUSTABLE FAN DUCT DEVICE

BACKGROUND

1. Field

The present invention relates to a fan duct device, and more particularly to a fan duct device for guiding airflow to improve air convection of a heat dissipation device installed within a computer enclosure, wherein a length of the fan duct device is adjustable so that position of a fan mounted on the fan duct can be easily altered.

2. Related Art

In the art of heat management, a heat sink having a fan mounted thereon is frequently employed. Commonly, a heat sink comprises a base for absorbing heat from a heat-generating component and a plurality of fins extending from the base to dissipate heat to an ambient environment. Channels are defined between adjacent fins of the heat sink for flow of air. The fan is mounted to a top or a side of the heat sink to enhance air convection in the channels. However, the heat sink and the fan are usually positioned in an enclosure in which the heat-generating component is set. Whether the fan is used to blow air to the heat sink or to draw heated air away from the heat sink, the air passing through and heated by the heat sink is subject to mixture with fresh air and enter the heat sink again. This adversely degrades the heat discharge ability of the heat sink.

To overcome the foregoing disadvantage of the heat sink/fan combination, a fan duct device has been developed. An end of the fan duct device is mounted with a fan. An opposite end of the fan duct device is engaged with an enclosure of a computer and communicates with an exterior of the enclosure. During operation of the fan, fresh air can be directly drawn into the heat sink from an exterior of the enclosure through the fan duct device when the fan is used to blow air to the heat sink, or the air passing through and heated by the heat sink can be directly discharged to the exterior of the enclosure through the fan duct device when the fan is used to draw heated air away from the heat sink. Therefore, by the use of the fan duct device, the heated air will not mix with the fresh air and flow again toward the heat sink. As a result, a better heat-dissipation efficiency can be achieved.

Unfortunately, the fan duct generally has a fixed configuration and dimension, whereas specification of the enclosure is varied. Consequently, the fan duct device cannot be adjusted to meet an enclosure with a different specification.

SUMMARY

Accordingly, what is needed is a fan duct device which has a length adjustable so that the fan duct device can be universally used in different computer enclosures having different specifications.

A fan duct device in accordance with a preferred embodiment of the present invention comprises a ventilating pipe, a barrel and a holding frame. The ventilating pipe comprises two spring levers integrally formed on the ventilating pipe. A handling tab and an engaging tab extend from a free end of each spring lever, respectively outwardly and inwardly. The barrel forms two jagged members thereon. Each jagged member forms a plurality of parallel teeth thereon. The engaging tabs are selectively engaged with corresponding teeth respectively to position the barrel to the ventilating pipe when the barrel is moved to a desired location in the ventilating pipe. The engaging tabs are also escapable from the teeth by pulling the handling tabs outwardly to allow the barrel to be movable on the ventilating pipe. The holding frame is positioned to the barrel for holding a fluid-driving device thereon. The fluid-driving device is a fan for being proximate to a heat sink in an enclosure of a computer wherein the fan duct device is mounted. The ventilating pipe has a funneled portion with a large end. The large end forms a planar abutting flange thereon for abutting an inner side of the enclosure and surrounding a ventilating port defined in the enclosure.

Other advantages and novel features will become more apparent from the following detailed description when taken in conjunction with the accompanying drawings, in which:

DETAILED DESCRIPTION OF THE PREFERRED EMBODIMENT

Figure 1:
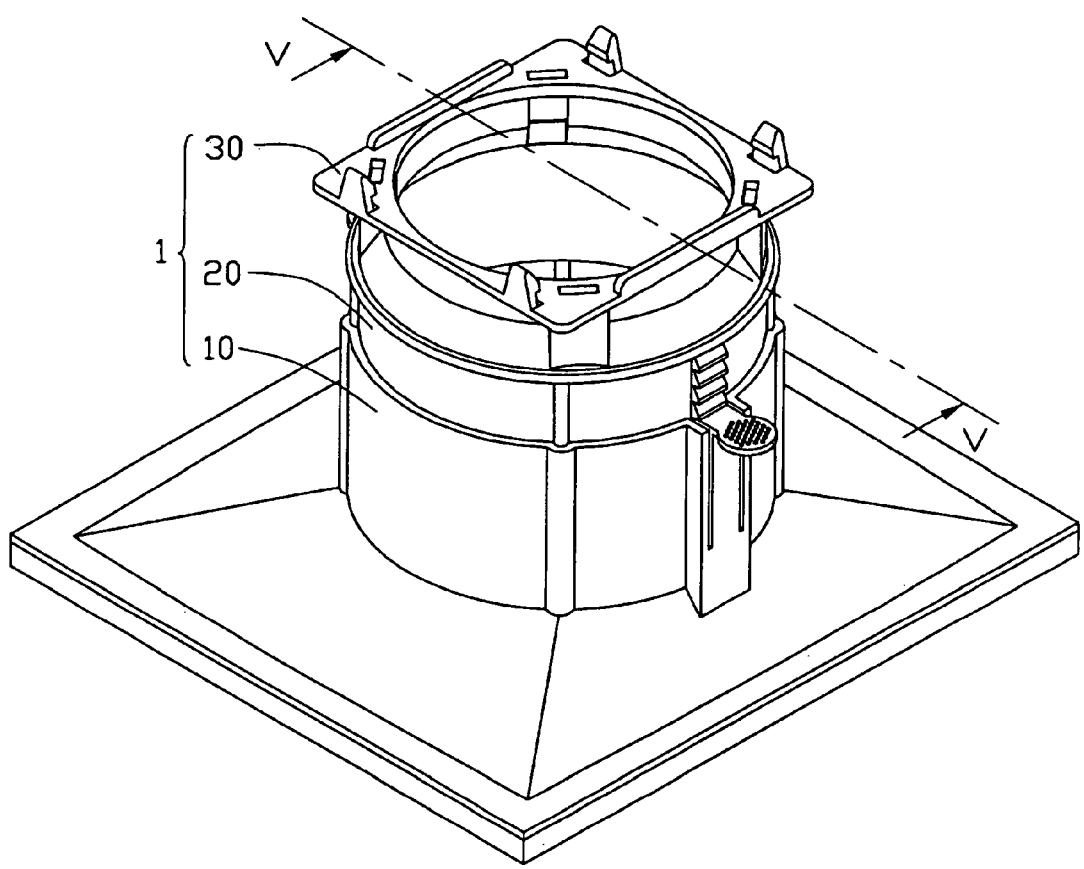
FIG. 1 is an isometric view of a fan duct device in accordance with a preferred embodiment of the present invention comprising a ventilating pipe, a slidable barrel and a holding frame.

Referring to FIG. 1, a fluid guiding device, such as a fan duct device 1 in accordance with a preferred embodiment of the present invention comprises a ventilating pipe 10, a slidable barrel 20 and a holding frame 30. The holding frame 30 is used to hold a fluid-driving device, such as a fan (not shown) thereon.

Figure 2:
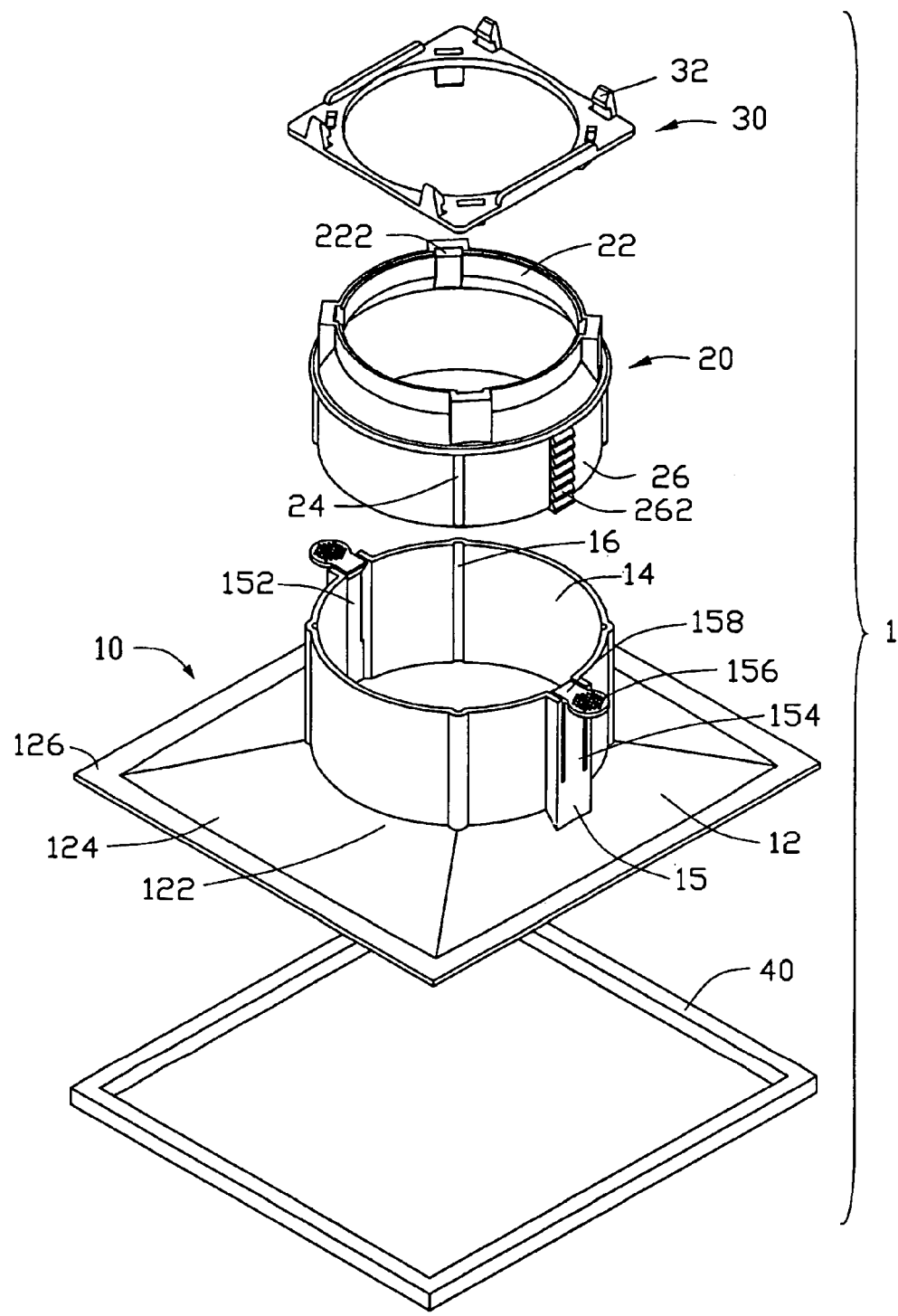
FIG. 2 is an exploded, isometric view of FIG. 1.

Particularly referring to FIG. 2, the ventilating pipe 10 comprises a funneled portion 12 having a small upper end 122 and a large lower end 124. A planar abutting flange 126 is extended from a free edge of the large lower end 124, for abutting against an inside of an enclosure (not shown) of a computer wherein a ventilating port (not shown) is formed. In the preferred embodiment, a hermetical pad 40 is provided on the abutting flange 126 to enhance an air-tight engagement between the abutting flange 126 and the enclosure. The abutting flange 126 and the pad 40 have a corresponding rectangular configuration.

The ventilating pipe 10 further comprises a tubular portion 14 which is integrally extended upwardly from the small upper end 122 of the funneled portion 12 and defines an air passageway (not labeled) therein. A pair of elongated bulges 15 symmetrically and outwardly extends from the tubular portion 14 and parallel to an axis of the tubular portion 14. Two expansion slots 152 are defined in the bulges 15 respectively. The expansion slots 152 communicate with the air passageway of the ventilating pipe 10. A cantilevered spring lever 154 is integrally formed on an upper portion of each bulge 15 and located in a corresponding slot 152. A handling tab 156 and an engaging tab 158 extend from a free end of each spring lever 154, in opposite directions respectively and perpendicular to the spring lever 154. The handling tab 156 is extended outwardly and the engaging tab 158 is extended inwardly. By pulling the tab 156 outwardly, the spring lever 154 moves outwardly correspondingly. Four guiding grooves 16 are defined in the tubular portion 14 deviated from and parallel to the bulges 15. The guiding grooves 16 are extended parallel to the axis of the tubular portion 14.

Figure 3:
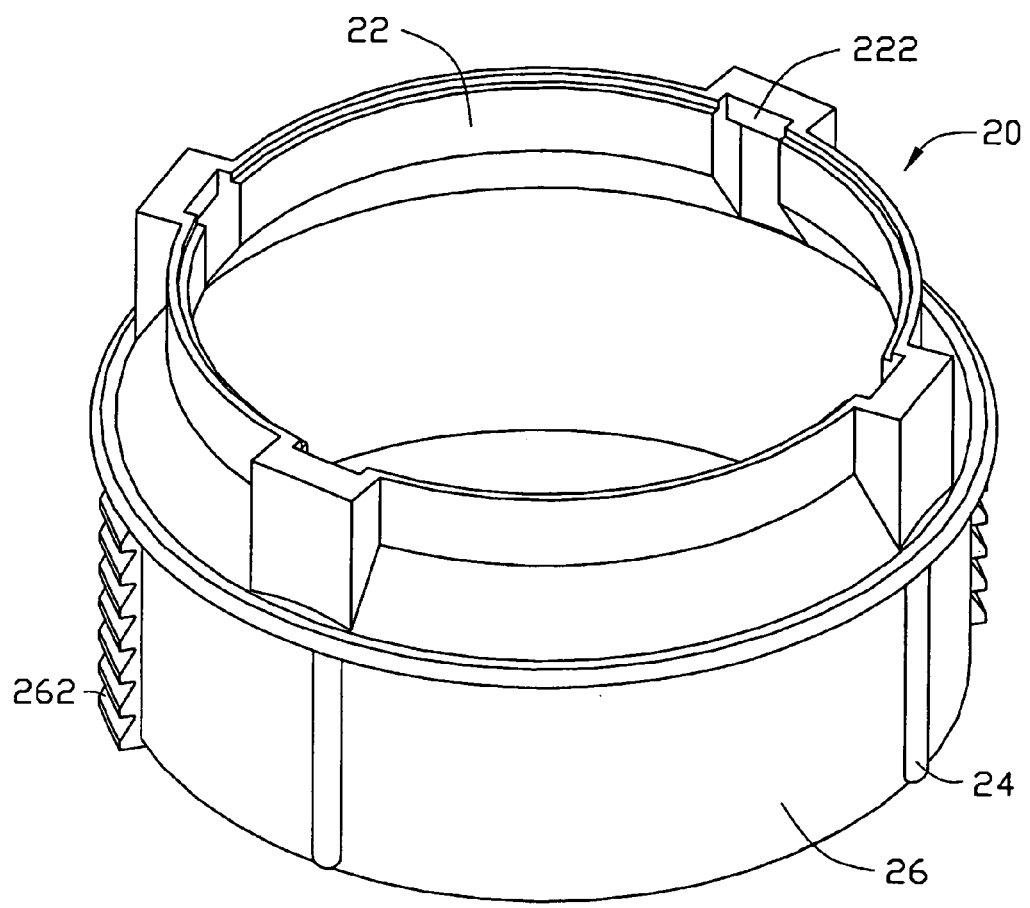
FIG. 3 is an enlarged view of the slidable barrel of FIG. 2.
Figure 5:
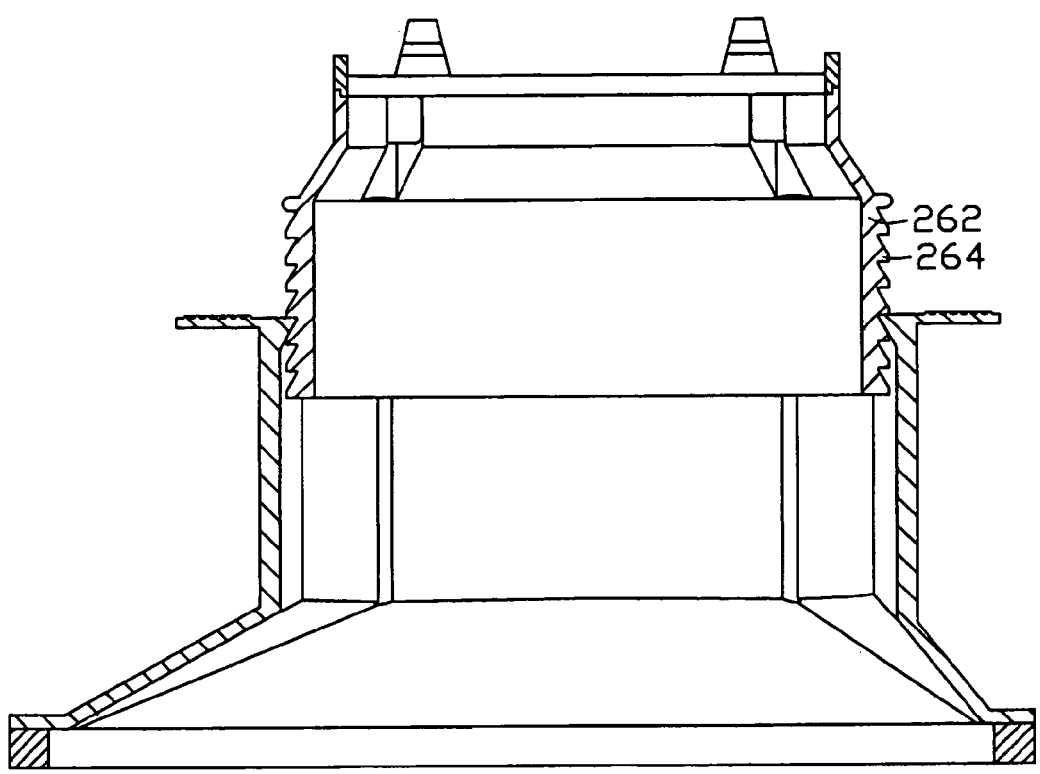
FIG. 5 is an enlarged cross-sectional view of FIG. 1, taken along line V-V thereof.

Particularly referring to FIGS. 2 and 3, the slidable barrel 20 comprises a connecting portion 22 at a top end thereof. Four blocks 222 are formed at the connecting portion 22. A lower portion of the slidable barrel 20 can be inserted into the tubular portion 14 of the ventilating pipe 10 and be movable in the tubular portion 14, and is thus named as an adjusting portion 26 due to its adjustable engagement within the tubular portion 14. Two elongated jagged members 262 each comprising a plurality of parallel teeth 264 (best seen in FIG. 5), are raised outwardly and oppositely from the slidable barrel 20. Each jagged member 262 extends along a line parallel to an axis of the slidable barrel 20. The teeth 264 each have an inclined upper surface (not labeled) and a horizontal bottom surface (not labeled). Four ribs 24 are outwardly formed on the adjusting portion 26 deviated from and parallel to the jagged members 262. The ribs 24 are extended parallel to the axis of the slidable barrel 20.

Figure 4:
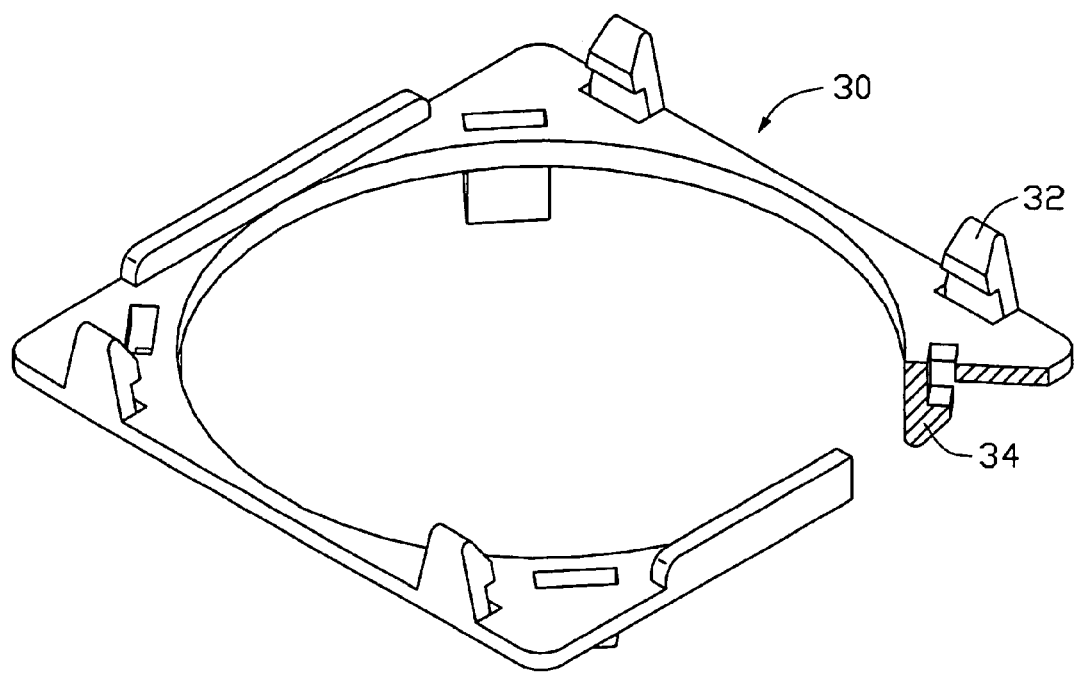
FIG. 4 is an enlarged view of the holding frame of FIG. 2, with a part thereof being cut away.

Particularly referring to FIGS. 2 and 4, the holding frame 30 has a substantially rectangular configuration and comprises a top side (not labeled) for supporting the fan thereon and a bottom side (not labeled) opposite to the top side. The holding frame 30 defines a central opening (not labeled) through the top and bottom sides of the holding frame 30, for providing an airflow passageway from the fan to the slidable barrel 20. Four inward-facing catches 32 are extended perpendicularly from the top side of the holding frame 30 and adjacent to four corners of the holding frame 30, for catching the fan on the holding frame 30 therebetween. Four outward-facing hooks 34 are extended perpendicularly from the bottom side of the holding frame 30 and adjacent to the four corners of the holding frame 30, for hooking the blocks 222 of the slidable barrel 20. The catches 32 are disposed near an outer periphery of the holding frame 30. The hooks 34 are disposed near the central opening defined in the holding frame 30.

In assembly of the fan duct device 1, the hooks 34 of the holding frame 30 are locked with the blocks 222 of the slidable barrel 20 so that the holding frame 30 is secured to the slidable barrel 20 and movable therewith. The adjusting portion 26 of the slidable barrel 20 is inserted into the tubular portion 14 of the ventilating pipe 10 with the ribs 24 slidably received in the guiding grooves 16, respectively. By the fitting between the ribs 24 and the guiding grooves 16, the sliding barrel 20 cannot rotate relative to the ventilating pipe 10. The jagged members 262 are accommodated in the expansion slots 152 in which the handling tabs 156 are pulled outwardly so that the sliding barrel 20 can slide freely on the tubular portion 14 of the ventilating pipe 10, whereby a length of the fan duct device 1 is adjustable. When the length of the fan duct device 1 reaches a predetermined length in which the fan can be located adjacent to a heat sink (not shown) in the computer, and the hermetical pad 40 can be hermetically attached to an inside of the enclosure, the pulling force on the handling tabs 156 is released so that the engaging tabs 158 are locked with corresponding teeth 264 of the jagged members 262, respectively. The design of the guiding grooves 16 and the ribs 24 also ensures that when the sliding barrel 20 and the ventilating pipe 10 are assembled together, each engaging tab 158 can always be aligned with a corresponding jagged member 262 and thus selectively engage with a corresponding tooth 264 thereof.

To adjust the length of the fan duct device 1, first the handling tabs 156 are pulled outwardly whereby the spring levers 154 are moved outwardly accordingly so that the engaging tabs 158 move outwardly and are disengaged from the jagged members 262. At this stage, the ribs 24 of the slidable barrel 20 are capable of sliding in the guiding grooves 16 of the ventilating pipe 10 again. The length of the fan duct device 1 is then changed by moving the slidable barrel 20 upwardly or downwardly. When the fan duct device 1 reaches a desired other length, the handling tabs 156 are released from the pulling force acting thereon, so that the spring levers 154 are returned back to their original positions. The engaging tabs 158 are thus engaged with other teeth 264 of the jagged members 262. The slidable barrel 20 is therefore fixed to the tubular portion 14 at a desired other position and the fan duct device 1 has the desired other length.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A fluid guiding device comprising:
   a ventilating pipe comprising a pair of spring levers integrally formed on the ventilating pipe, a handling tab and an engaging tab extending from a free end of each of the spring levers, respectively outwardly and inwardly;
   a slidable barrel forming two jagged members thereon, each of the jagged members comprising a plurality of parallel teeth; and
   a holding frame positioned to the slidable barrel, adapted for holding a fluid-driving device thereon;
   wherein the engaging tabs are selectively engaged with corresponding teeth respectively to position the slidable barrel to the ventilating pipe when the slidable barrel is moved to a desired location in the ventilating pipe and wherein the engaging tabs are escapable from the corresponding teeth by pulling the handling tabs outwardly to allow the slidable barrel to be movable on the ventilating pipe.

2. The fluid guiding device of claim 1, wherein at least one guiding groove is defined in the ventilating pipe, and wherein at least one rib is formed on the slidable barrel and is capable of sliding along an axial direction in the at least one guiding groove.

3. The fluid guiding device of claim 1, wherein the ventilating pipe comprises a tubular portion engaging with the slidable barrel.

4. The fluid guiding device of claim 3, wherein a pair of bulges is symmetrically and outwardly formed on the tubular portion and wherein the spring levers are extended from the bulges, respectively.

5. The fluid guiding device of claim 4, wherein two slots are defined in the bulges respectively, and wherein the jagged members are accommodated in the slots respectively.

6. The fluid guiding device of claim 3, wherein the ventilating pipe further comprises a funneled portion having a small end in integration with the tubular portion and a large end remote from the small end.

7. The fluid guiding device of claim 6, wherein a planar abutting flange is extended from a free edge of the large end and a hermetical pad is provided on the abutting flange.

8. The fluid guiding device of claim 1, wherein a plurality of blocks is formed at an end of the slidable barrel outside the ventilating pipe, and wherein a plurality of hooks is extended perpendicularly from the holding frame, the hooks are locked with the blocks of the slidable barrel so that the holding frame is securely positioned to the slidable barrel.

9. The fluid guiding device of claim 1, wherein a plurality of catches is extended perpendicularly from the holding frame adapted for catching the fluid-driving device therebetween.

10. A fluid guiding device comprising:
a fluid inlet portion;
a fluid outlet portion; and
a central portion fluidly communicated with the inlet portion and the outlet portion, the central portion comprising a pipe having a spring lever extended therefrom and a barrel defining a plurality of teeth thereon, an engaging tab and a handling tab perpendicularly extending from the spring lever in opposite directions, the engaging tab being selectively engaged with any one of the teeth to position the barrel to the pipe and being escapable from said any one of the teeth by pulling the handling tab to allow the barrel to be movable relative to the pipe.

11. The fluid guiding device of claim 10, wherein the teeth are parallel to each other and arranged on a line parallel to an axial direction of the barrel.

12. The fluid guiding device of claim 10, wherein two bulges each defining a slot therein are symmetrically raised from the pipe and two jagged members forming the teeth thereon are formed on the barrel, and wherein the jagged members are received in the slots of the bulges.

13. The fluid guiding device of claim 10, wherein at least one guiding groove is defined in the pipe, and wherein at least one rib is formed on the barrel and slidably received in the at least one guiding groove for preventing the barrel from rotating relative to the pipe.

14. A fan duct device for use in a computer enclosure defining a ventilating port, comprising:
a ventilating pipe having an end portion adapted for attaching to the enclosure around the ventilating port and a tubular portion extending from the end portion and forming a cantilevered spring lever having an engaging tab thereon;
a barrel slidably mounted on the ventilating pipe, having a jagged member thereon, the engaging tab being able to lock with the jagged member at a selected position of the jagged member so that a length of the barrel combined with the ventilating pipe is adjustable;
a holding frame adapted for holding a fan thereon, being fixed on the barrel so that the holding frame can move with the barrel; and
a hermetical pad;
wherein the end portion of the ventilating pipe has a small end connecting with the tubular portion and a large end opposite the small end and adapted for attaching to the enclosure; and
wherein the hermetical pad is attached to the large end of the end portion of the ventilating pipe.

15. The fan duct device of claim 14, wherein the tubular portion of the ventilating pipe forms a groove therein, and the barrel forms a rib thereon, the rib slidably engaging in the groove.

16. The fan duct device of claim 15, wherein the engaging tab is formed at a free end of the spring lever and extends inwardly, the free end of the spring lever further comprising a handling tab extending outwardly, the handling tab being adapted for receiving a force for driving the engaging tab to leave away from the jagged member.

17. The fan duct device of claim 14, wherein the jagged member has a plurality of teeth formed thereon, each tooth having an inclined surface and a horizontal surface, the inclined surface being located closer to the holding frame than the horizontal surface.

18. The fan duct device of claim 16, wherein the holding frame has a catch extending in a direction away from the barrel, the catch being adapted for locking with the fan, and a hook engaging with the barrel.

* * * * *